(12) United States Patent
Chiou et al.

(10) Patent No.: US 7,897,481 B2
(45) Date of Patent: Mar. 1, 2011

(54) HIGH THROUGHPUT DIE-TO-WAFER BONDING USING PRE-ALIGNMENT

(75) Inventors: Wen-Chih Chiou, Miaoli (TW);
Weng-Jin Wu, Hsin-Chu (TW);
Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 81 days.

(21) Appl. No.: 12/329,304

(22) Filed: Dec. 5, 2008

(65) Prior Publication Data
US 2010/0144068 A1 Jun. 10, 2010

(51) Int. Cl.
*H01L 21/98* (2006.01)
(52) U.S. Cl. .................. 438/455; 438/15; 257/E21.705; 257/E21.48
(58) Field of Classification Search .................... 438/15, 438/118, 406, 455–459, 615–617, 678–733, 438/787–796; 257/E21.705, E21.088, E21.122–E21.128, 257/E21.48, E21.512, E21.519, E21.567–E21.57, 257/E21.087–E21.088, E21.6–E21.601, E23.001–E23.194
See application file for complete search history.

(56) References Cited

U.S. PATENT DOCUMENTS 6,946,322 B2 * 9/2005 Brewer ........................ 438/109

* cited by examiner

*Primary Examiner*—Hsien-ming Lee
*Assistant Examiner*—Walter H Swanson
(74) *Attorney, Agent, or Firm*—Slater & Matsil, L.L.P.

(57) ABSTRACT

A method of forming integrated circuits includes providing a wafer that includes a plurality of dies; aligning a first top die to a first bottom die in the wafer; recording a first destination position of the first top die after the first top die is aligned to the first bottom die; bonding the first top die onto the first bottom die; calculating a second destination position of a second top die using the first destination position; moving the second top die to the second destination position; and bonding the second top die onto a second bottom die without any additional alignment action.

10 Claims, 7 Drawing Sheets

HIGH THROUGHPUT DIE-TO-WAFER BONDING USING PRE-ALIGNMENT

TECHNICAL FIELD

This invention relates generally to integrated circuit manufacturing processes, and more particularly to methods for bonding semiconductor dies onto wafers.

BACKGROUND

With the evolving of semiconductor technologies, semiconductor dies are becoming increasingly smaller. However, more functions need to be integrated into the semiconductor dies. Accordingly, the semiconductor dies need to have increasingly greater numbers of I/O pads packed into smaller areas, and the density of the I/O pads rises quickly. As a result, the packaging of the semiconductor dies becomes more difficult, which adversely affects the yield.

Package technologies can be divided into two categories. One category is typically referred to as wafer level package (WLP), wherein dies on a wafer are packaged before they are sawed. The WLP technology has some advantages, such as greater throughput and lower cost. Further, less under-fill and/or molding compound is needed. However, WLP suffers from drawbacks. As aforementioned, the sizes of the dies are becoming increasingly smaller, and the conventional WLP can only be fan-in type packages, in which the I/O pads of each die are limited to a region directly over the surface of the respective die. With the limited areas of the dies, the number of the I/O pads is limited due to the limitation of the pitch of the I/O pads. For example, if the pitch of the I/O pads is to be decreased, solder bridges may occur. Additionally, under the fixed-ball-size requirement, solder balls must have a certain size, which in turn limits the number of solder balls that can be packed on the surface of a die.

In the other category of packaging, dies are sawed from wafers before they are packaged onto other wafers, and only "known-good-dies" are packaged. An advantageous feature of this packaging technology is the possibility of forming fan-out chip packages, which means the I/O pads on a die can be redistributed to a greater area than the die itself, and hence the number of I/O pads packed on the surfaces of the dies can be increased.

Figure 1:
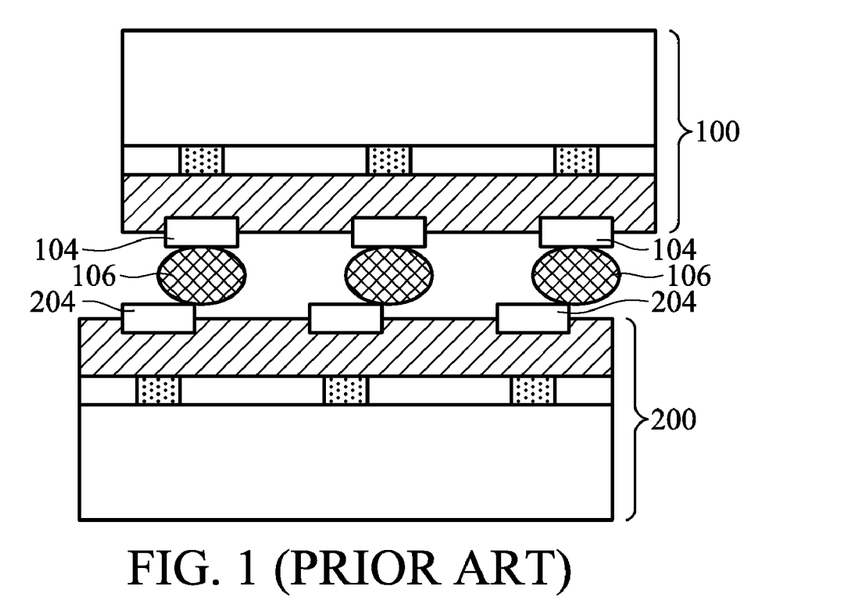
FIGS. 1 and 2 illustrate a conventional solder bonding process, wherein top dies are bonded onto bottom dies by resorting to the self-alignment caused by the reflow of solder balls.
Figure 2:
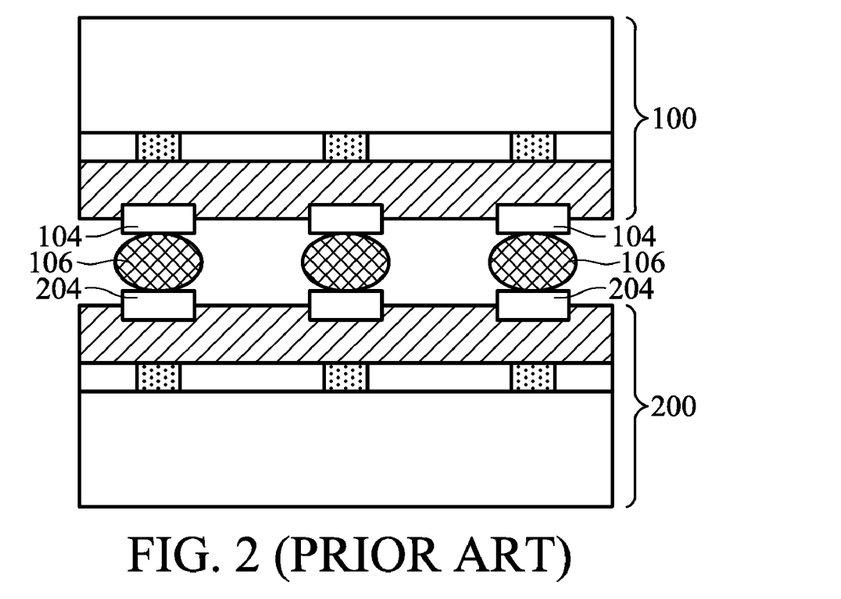

The bonding of dies to wafers includes dielectric-to-dielectric bonding (also referred to as fusion bonding), copper-to-copper bonding, adhesive bonding, and solder bonding. FIG. 1 illustrates a solder bonding scheme, wherein top die 100 is bonded onto bottom die 200 (which may be in a bottom wafer) through solder balls 106, which are placed between bond pads 104 and 204. A reflow is then performed to melt solder balls 106. In the case solder balls 106 are big enough, this bonding process is self-aligned, since the melted solder balls 106 may help the alignments of bond pads 104 to the respective bond pads 204, as is shown in FIG. 2.

Figure 3:
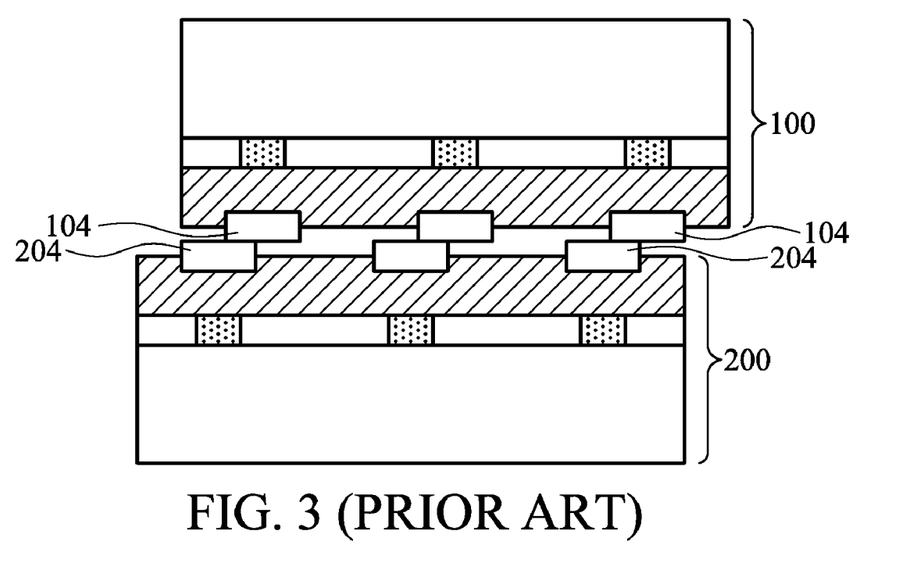
FIG. 3 illustrates a conventional direct copper-to-copper bonding process.

In the case copper-to-copper direct bonding is performed, or in the case solder balls 106 are not big enough, there will be no self-alignment effect. Referring to FIG. 3, top die 100 is bonded onto bottom die 200 with bond pads 104 and 204 contacting each other directly, or bonded through very thin solder films (not shown). If bond pads 104 are misaligned to bond pads 204, the misalignment cannot be corrected by the subsequent reflow, if any. Therefore, each of the top dies has to be aligned to the bottom die accurately. This requires that the bonding of each of the top dies be accompanied by an alignment step. The throughput is thus significantly reduced. New bonding methods are thus needed to improve throughput without sacrificing the accuracy of the alignment.

SUMMARY OF THE INVENTION

In accordance with one aspect of the present invention, a method of forming integrated circuits includes providing a wafer that includes a plurality of dies; aligning a first top die with a first bottom die in the wafer; recording a first destination position of the first top die after the first top die is aligned with the first bottom die; bonding the first top die onto the first bottom die; calculating a second destination position of a second top die using the first destination position; moving the second top die to the second destination position; and bonding the second top die onto a second bottom die without additional alignment actions.

In accordance with another aspect of the present invention, a method of forming integrated circuits includes providing a bottom wafer including bottom dies; providing a die tray including die holders; providing top dies; placing the top dies into the die tray; and placing the die tray adjacent to the bottom wafer, with an X-axis of the die tray being parallel to an X-axis of the bottom wafer. Next, the first top die is picked up and aligned to a first bottom die in the bottom wafer. The coordinates of the first top die are recorded after alignment. The first top die is bonded onto the first bottom die. The method further includes calculating a position of a second top die to be moved according to the coordinates. The position of the second top die corresponds to a second bottom die in the bottom wafer. The second top die is bonded to the second bottom die without an action for aligning the second top die to the second bottom die.

In accordance with yet another aspect of the present invention, a method of forming integrated circuits includes providing a bottom wafer including bottom dies. The bottom wafer includes a first bottom die and a second bottom die. Top dies, which include a first top die and a second top die, are placed into the holders of a die tray. The die tray is then placed adjacent to the bottom wafer, with an X-axis of the die tray being parallel to an X-axis of the bottom wafer. An x-coordinate and a y-coordinate of the second bottom die relative to the first bottom die are determined. The method further includes picking up and aligning a first top die to the first bottom die in the wafer; bonding the first top die onto the first bottom die; and recording a first x-coordinate and a first y-coordinate of the first top die after it is aligned to the first bottom die. A second x-coordinate is calculated by adding the first x-coordinate and the relative x-coordinate. A second y-coordinate is calculated by adding the first y-coordinate and the relative y-coordinate. The second top die is then picked up and moved to a second position corresponding to the second x-coordinate and the second y-coordinate, and bonded onto the second bottom die.

The advantageous features of the present invention include self-alignment resulting from the accurate alignment of die holders in a die tray, and hence only one top die needs to be aligned when bonded. The throughput of the bonding process is thus significantly increased.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4A through 13 are cross-sectional views and top views of intermediate stages in a bonding process.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method of bonding dies on a wafer is provided. The intermediate stages of performing a preferred embodiment of the present invention are illustrated. Throughout the various views and illustrative embodiments of the present invention, like reference numbers are used to designate like elements. In the following discussed embodiments, top dies are bonded to a bottom wafer through flip-chip (face-to-face) bonding. However, the bonding method provided by the present invention may be used with other bonding methods, such as back-to-back bonding, face-to-back bonding, or the like. Further, the bonding method provided by the present invention may be used with other bonding methods besides metal-to-metal bonding, such as dielectric-to-dielectric bonding, solder bonding, adhesive bonding, and the like.

Figure 4A:
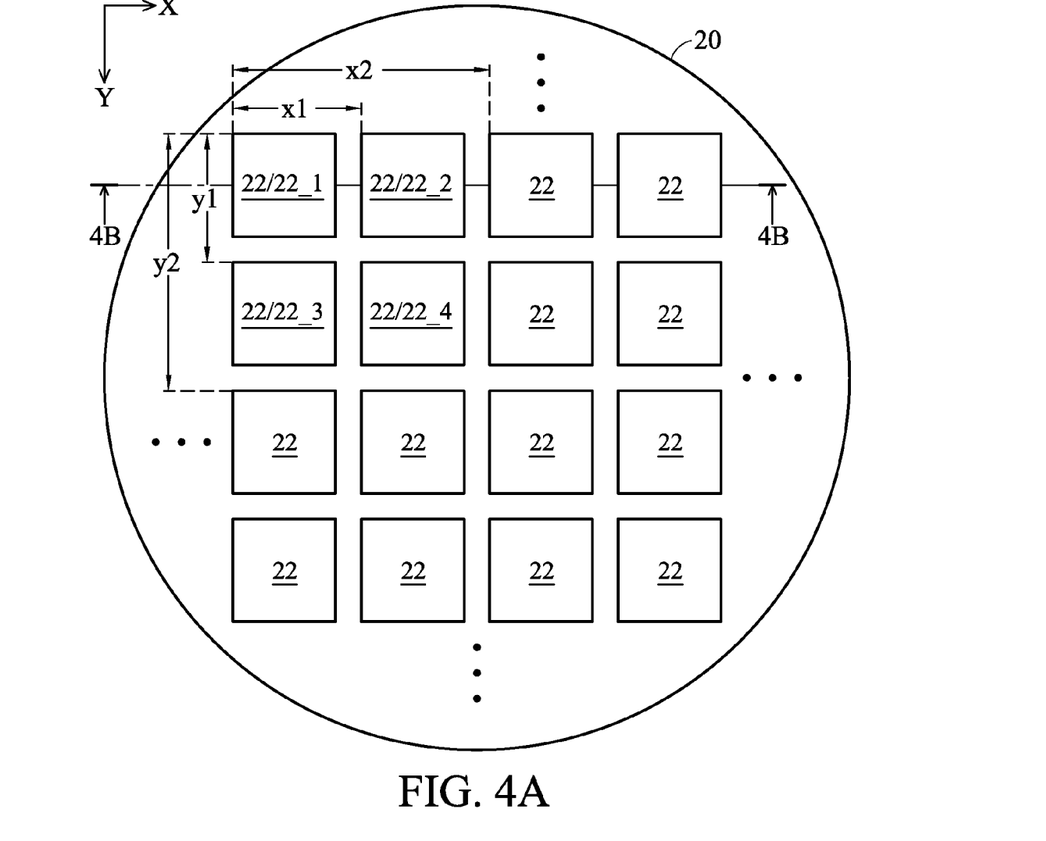
Figure 4B:
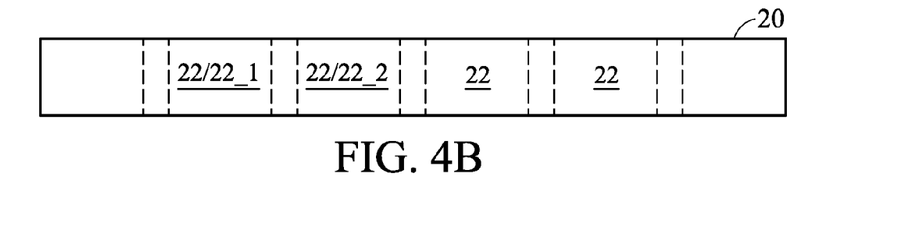

FIGS. 4A and 4B are a top view and a cross-sectional view, respectively, of bottom wafer 20, on which dies will be bonded. Bottom wafer 20 includes a plurality of bottom dies 22, which may be arranged, for example, similar to an array with a plurality of rows and columns. Each of the bottom dies 22 has a position relative to any of the other dies. In the subsequent discussion, a corner die, for example, top corner bottom die 22_1 is used as a reference point for defining the positions of other dies, although any other bottom die 22 may also be used as the reference point. The relative positions of other dies may be defined using, for example, coordinates. Accordingly, bottom die 22_1 may be defined to have a relative position (to itself) of (0, 0), and the relative positions of other dies may be (x1, 0) for bottom die 22_2, (0, y1) for bottom die 22_3, (x1, y1) for bottom die 22_4, and the like. The positions of the additional dies may be recorded using x2, y2, and the like. Although FIGS. 4A and 4B show that the corner positions of bottom dies 22 are defined as the position of the respective bottom dies 22, the positions of bottom dies 22 may be defined as the positions of any other features such as markings, pads, and the like. However, the criteria for defining the positions of bottom dies 22 need to be uniform throughout all of the bottom dies 22. For example, if the left top corner of bottom die 22_1 is defined as being the position of bottom die 22_1, then all positions of other bottom dies 22 need to be defined by their respective left top corners.

FIG. 4B illustrates a cross-sectional view of bottom wafer 20, wherein the cross-sectional view is taken along a plane crossing line 4B-4B in FIG. 4A.

Figure 5A:
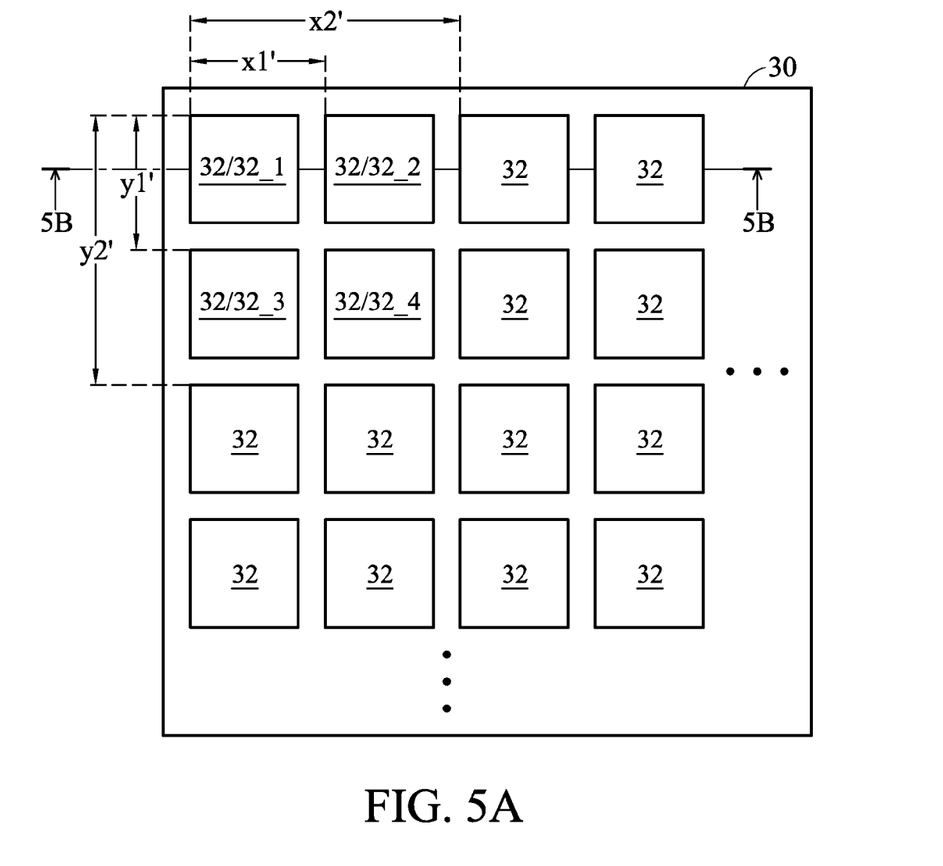
Figure 5B:
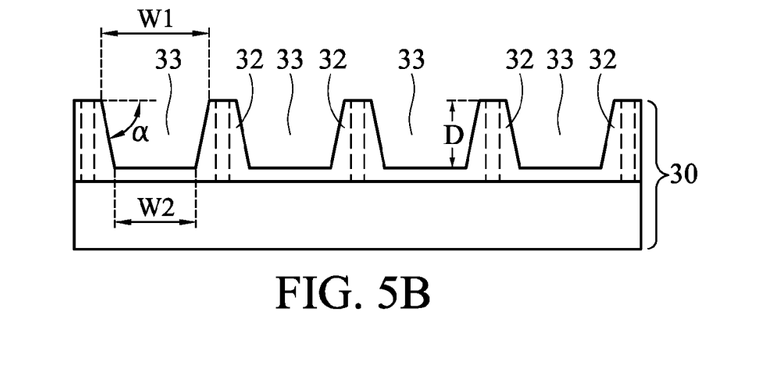

FIGS. 5A and 5B illustrate a top view and a cross-sectional view, respectively, of die tray 30 customized for holding the top dies that will be bonded onto bottom dies 22. In an embodiment, die tray 30 includes a plurality of die holders 32, which die holders include recesses 33 for holding the top dies (not shown). Accordingly, if a top corner die holder 32_1 is defined to have a relative position (to itself) of (0, 0), the relative positions of other die holders 32 will be (x1', 0) for die holder 32_2, (0, y1') for die holder 32_3, (x1', y1') for die holder 32_4, and the like. The sides of die holders 32 need to be exactly parallel to, or perpendicular to, each other. In the preferred embodiment, die holders 32 have relative positions matching the relative positions of bottom dies 22 (FIG. 4A) as much as possible. Accordingly, x1 is equal to x1' and y1 is equal to y1'. In alternative embodiments, the relative positions, of bottom dies 22 do not have to match that of die holders 32. Die tray 30 may (although is not required to) have a circular shape that mimics the shape of bottom die 22, with each of die holders 32 corresponding to one of the bottom dies 22 in the same row and same number. Alternatively, die tray 30 is rectangular (which may be a square).

FIG. 5B illustrates a cross-sectional view of die tray 30, wherein the cross-sectional view is taken along a plane crossing line 5B-5B in FIG. 5A. In an embodiment, die holders 32 have slanted sidewalls, with the bottom width W2 being smaller than the top width W1. In other words, top slant angles α of die holders 32 are less than 90 degrees. The preferred slant angle α is between about 45 degrees and about 90 degrees. The details of the top slant angles α are discussed in subsequent paragraphs. In an embodiment of the present invention, top slant angle α is about 54.7 degrees, although other greater or smaller angles may also be used, depending on the shape of top dies (not shown).

Figure 6:
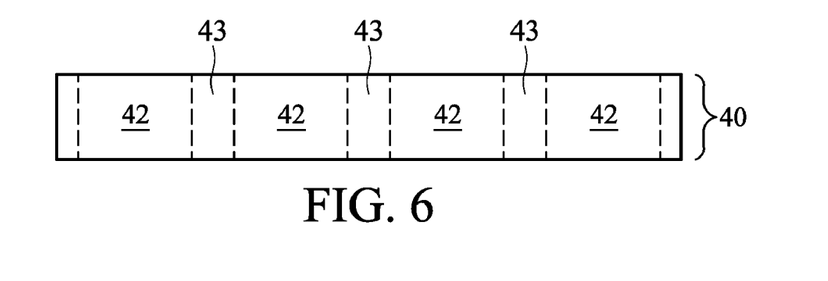
Figure 7:
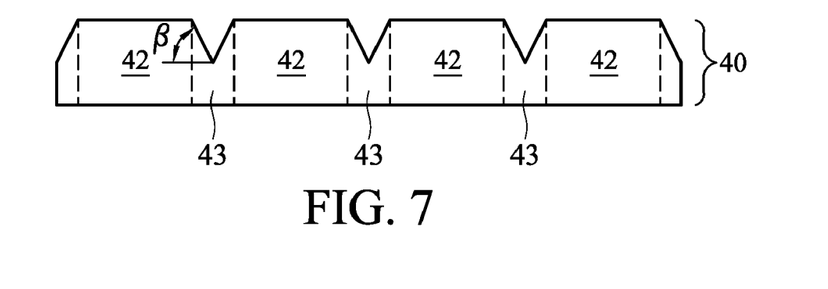

FIG. 6 illustrates a cross-sectional view of top wafer 40, which includes a plurality of top dies 42. Top wafer 40 is etched, as is shown in FIG. 7. In an embodiment, the etching is performed to the front surface of top wafer 40, wherein the front surface is the surface having bond pads 44 (not shown in FIG. 7, refer to FIG. 10B) thereon. Top wafer 40 is etched along scribe lines 43. The etch is preferably anisotropic, or has both anisotropic and isotropic components. In an embodiment, an anisotropic etch is first performed, then the etching recipe is adjusted to add an isotropic component in order to form slanted edges for top dies 42 with slant angle β. The etchant recipe may be adjusted to form different slant angles β. However, slant angle β and slant angle α as shown in FIG. 5B are preferably equal to each other. This may be achieved, for example, by determining etchant recipes to perform experimental etchings to find out the respective slant angles β. If a slant angle β is desirable, then die tray 30 is formed to make slant angle α equal to the desirable slant angle β.

Figure 8:
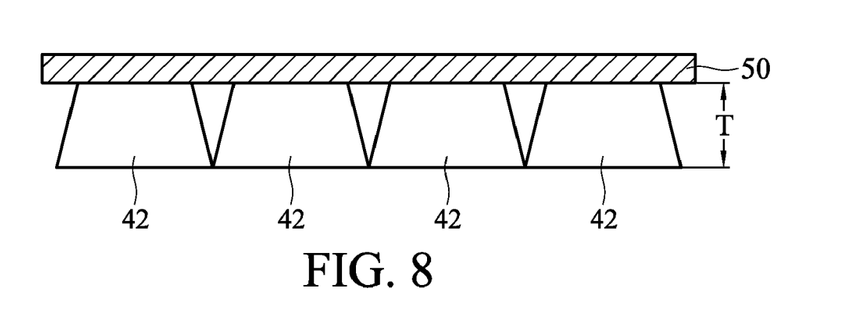

Next, as shown in FIG. 8, glass wafer or tape 50 is attached to the front surface of top dies 42, and the back surface of wafer 40 is grinded, until top dies 42 are separated from each other. The depth T of the resulting top dies 42 is preferably substantially equal to, although it may also be different from, the depth D of die holders 32 (refer to FIG. 5B).

Figure 9:
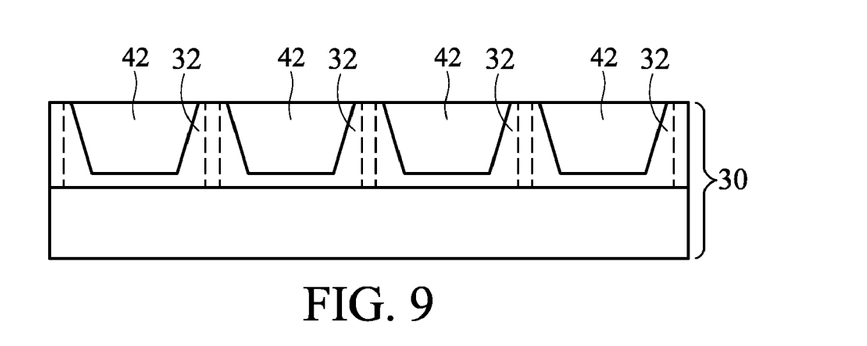

Referring to FIG. 9, top dies 42 are sorted, and known-good dies 42 are placed into die tray 30. Top dies 42 are arranged in the same direction, so that they may be picked up and bonded without being rotated first. Since the bottoms of die holders 32 are narrower than the tops, top dies 42 are easily self-aligned to fit die holders 32.

Figure 10A:
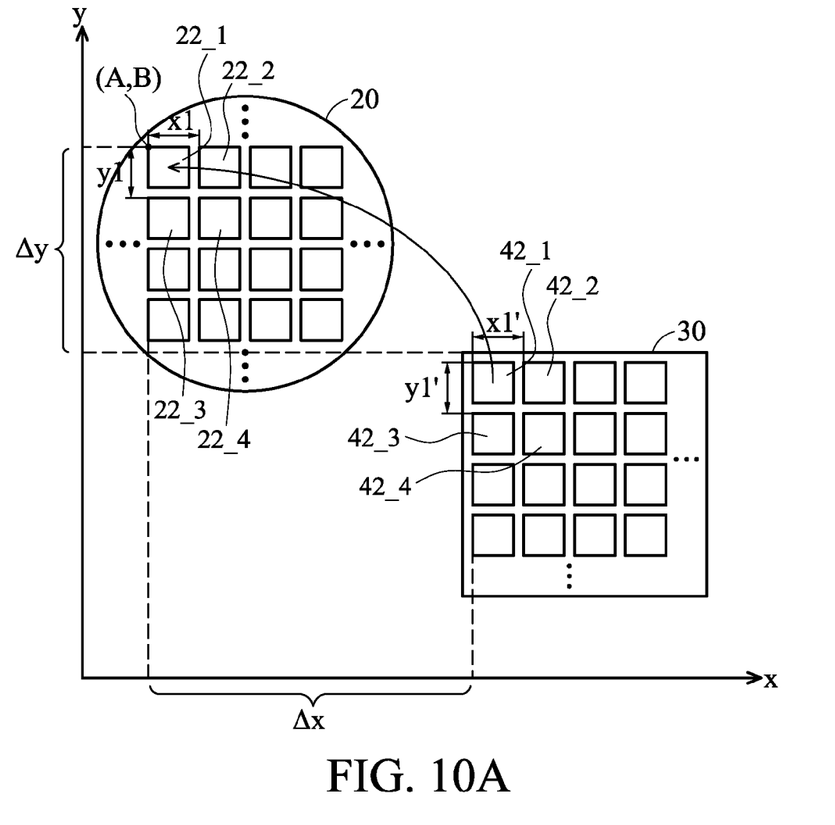
Figure 10B:
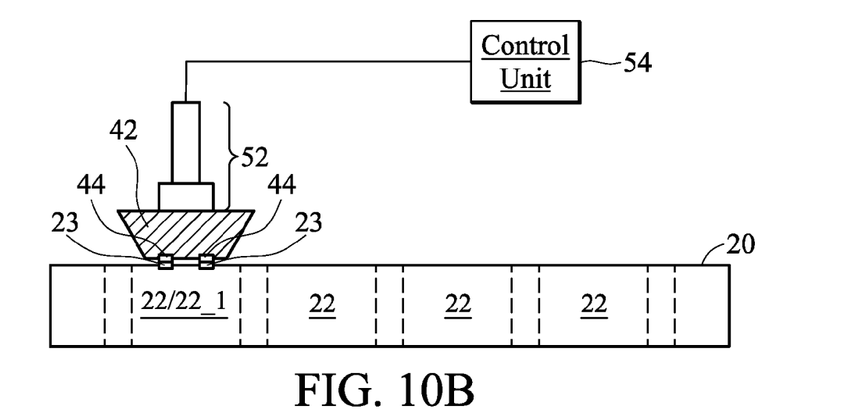

FIG. 10A illustrates the bonding of a first top die 42, which is preferably a corner die used as the reference point for defining relative positions of other top dies 42 (refer to FIG. 4A). First, die tray 30 and bottom wafer 20 are placed close to each other, with the X-axis of die tray 30 being parallel to the X-axis of bottom wafer 20, and Y-axis of die tray 30 being parallel to the Y-axis of bottom wafer 20. Bond head 52 (refer to FIG. 10B) picks up the first top die 42 from die tray 30, and bonds the first top die 42 onto a bottom die 22. For example, if the first top die 42 is the top die 42_1, then the first bottom die 22 is preferably (although is not required to be) the bottom die 22_1. Bond head 52 moves top die 42 and aligns it to the respective bottom die 22, so that an accurate bonding is performed, with bond pads 44 (refer to FIG. 10B) in top die 42_1 accurately aligned to bond pads 23 in bottom die 22_1. The movement of bond head 52 is controlled by control unit 54, which records the destination position (A, B) of top die 42_1 after it has been aligned.

Figure 11:
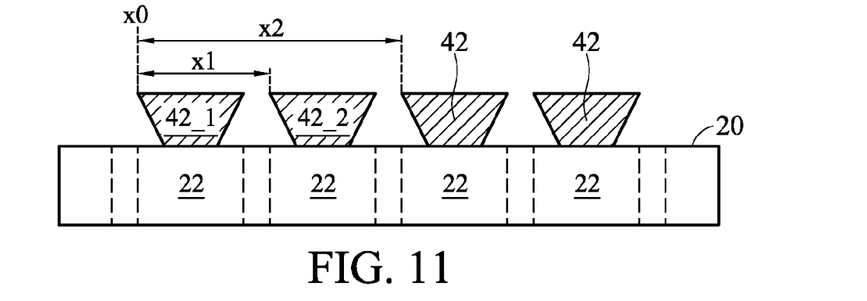

Next, as shown in FIG. 11, bond head 52 picks up remaining top dies 42 from die holders 32 one by one, and bonds each of them onto bottom dies 22 in corresponding positions. For example, top die 42_2 will be bonded onto bottom die 22_2, top die 42_3 will be bonded onto bottom die 22_3, and top die 42_4 will be bonded onto bottom die 22_4, and so on. Accordingly, when bonding top die 42_2, bond head 52 does not need to perform the alignment to align top die 42_2 to bottom die 22_2. Instead, control unit 54 (refer to FIG. 10B) calculates the destination position of top die 42_2. Bond head 52 just needs to pick up top die 42_2, and move top die 42_2 to the destination position (A+x1, B), and bond top die 42_1 to the underlying bottom die. Since the X-axis and the Y-axis of die tray 30 are parallel to the X-axis and Y-axis of bottom wafer 20, respectively, even though the top die 42_2 is bonded without performing the time-consuming alignment, top die 42_2 will be automatically aligned to the respective bottom die 22_2 accurately. Particularly, top die 42_2 does not need to rotate along a vertical axis, since the X-axis of die tray 30 is parallel to the x-axis of bottom wafer 20. Next, top die 42_3 is picked up and moved to destination position (A, B+y1) and bonded to bottom die 22_3 without any alignment action, and top die 42_4 is picked up and moved to destination position (A+x1, B+y1) and bonded to bottom die 22_4 without any alignment action. The remaining top dies 42 are bonded onto the bottom dies 22 at corresponding positions, using essentially the same method as described.

In alternative embodiments, control unit 54 calculates (ΔX, ΔY) and records the relative position between top die 42_1 and bottom die 22_1 after top die 42_1 is accurately aligned to bottom die 22_1. Control unit 54 then determines the positions of top die 42_2 (when it is in die tray 30) and bottom die 22_2, and calculates the distance for moving top die 42_2. The distance includes an x-direction distance and a y-direction distance. For top die 42_2 as shown in FIG. 10A, the distance is (ΔX+x1−x1', ΔY+y1−y1'). Bond head 52 then picks up top die 42_2 from tray 30, moving it by the distance (ΔX+x1−x1', ΔY+y1−y1') from die tray 30, and bond it onto bottom die 22_2 with no additional alignment action performed. It is expected that top die 42_2 will be aligned to bottom die 22_2 accurately even though no alignment action is performed. This bonding scheme is particularly simple if x1 is equal to x1', and y1 is equal to y1'. The remaining top dies 42 are bonded onto the bottom dies 22 at corresponding positions, using essentially the same method as bonding top die 42_2.

Figure 12:
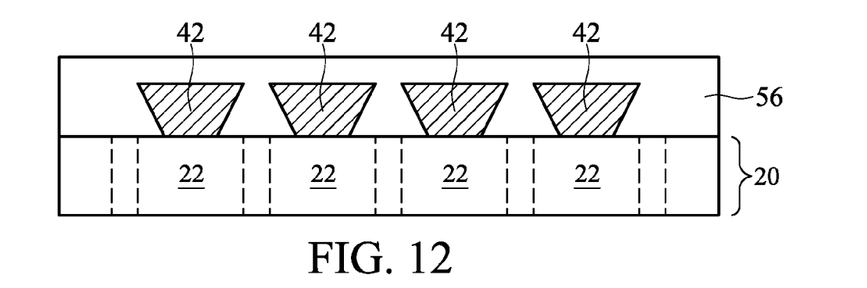
Figure 13:
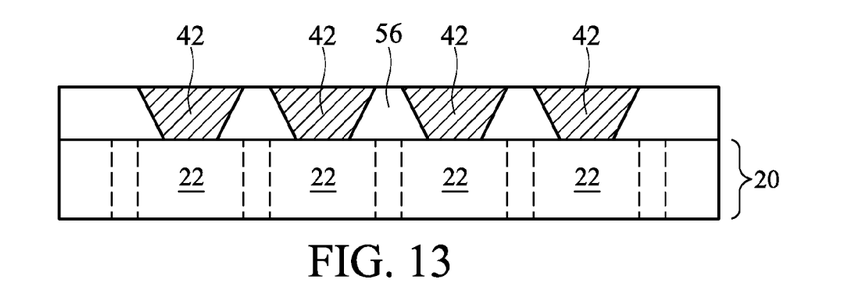

Referring to FIG. 12, after all top dies 42 are bonded onto bottom wafer 20, the gaps between top dies 42 are filled with molding compound 56, which may include a polymer. After molding compound 56 is solidified, excess molding compound 56 is removed or left un-removed, for example, through polishing. The back surfaces of top dies 42 are thus exposed, and the resulting structure is shown in FIG. 13. Next, further processes may be performed, including, but not limited to, stacking more dies onto the structure shown in FIG. 13, forming through-silicon vias in top dies 42 or bottom dies 22, and the like.

Figure 14:
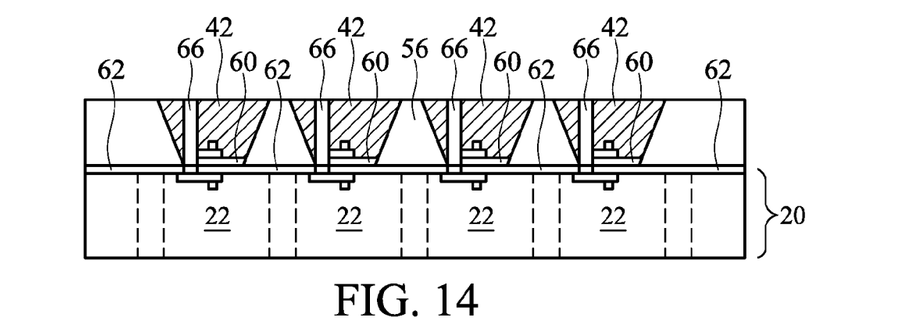
FIG. 14 illustrates an alternative embodiment, wherein top dies are bonded onto a bottom wafer through dielectric-to-dielectric bonding.

In above-discussed embodiments, direct metal-to-metal bonding or solder bonding (with little solder) is discussed. However, it is realized that the embodiments of the present invention may be used to perform any other bonding techniques such as dielectric-to-dielectric bonding or adhesive bonding. Referring FIG. 14, dielectric layers 60 in top dies 42 are bonded onto dielectric layer(s) 62 in bottom dies 22. The gaps between top dies 42 are then filled. Next, deep vias 66 are formed extending from the top surface of top dies 42 into bottom dies 22, so that the features in top dies 42 are electrically interconnected to the features in bottom dies 22. One skilled in the art, with the teaching provided in the embodiments of the present invention, may realize the formation details of other bonding schemes, such as face-to-back bonding, back-to-back bonding, and the like.

By forming die tray 30 with die holders 32 having their x-axes and y-axes accurately parallel to each other, only one of the dies (the first top die) needs to be aligned accurately per bottom wafer; the other dies may be quickly bonded according to the positions of the remaining top dies relative to the first top die. The throughput is thus significantly improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming integrated circuits, the method comprising:
   providing a bottom wafer comprising a plurality of bottom dies;
   aligning a first top die with a first bottom die in the bottom wafer;
   recording a first destination position of the first top die after the first top die is aligned with the first bottom die;
   bonding the first top die onto the first bottom die;
   calculating a second destination position of a second top die using the first destination position;
   moving the second top die to the second destination position; and
   bonding the second top die onto a second bottom die without any additional alignment action.

2. The method of claim 1 further comprising:
   providing a die tray comprising a plurality of die holders; and
   placing a plurality of top dies comprising the first top die and the second top die in the die tray, wherein the first top die and the second top die are picked up from the die tray to bond onto the first bottom die and the second bottom die.

3. The method of claim 2, wherein the die holders have slanted sidewalls with a first slant angle, and wherein the plurality of top dies comprises slanted edges with a second slant angle substantially equal to the first slant angle.

4. The method of claim 3 further comprising:
providing a top wafer;
etching a top surface of the top wafer along scribe lines; and
polishing a back surface of the top wafer to separate the top wafer into the plurality of top dies.

5. The method of claim 2 further comprising:
calculating destination positions of remaining ones of the plurality of top dies based on the first destination position; and
moving the remaining ones of the plurality of top dies onto the bottom wafer to the destination positions and performing bonding without performing additional alignment actions.

6. The method of claim 1, wherein, during the moving the second top die and the bonding the second top die, the second top die is not rotated along a vertical axis.

7. A method of forming integrated circuits, the method comprising:
placing top dies comprising a first top die and a second top die into die holders of a die tray;
placing the die tray adjacent to a bottom wafer, with an X-axis of the die tray being parallel to an X-axis of the bottom wafer;
determining a relative x-coordinate and a relative y-coordinate of a second bottom die in the bottom wafer relative to a first bottom die in the bottom wafer;
picking up and aligning the first top die with the first bottom die in the bottom wafer;
recording a first x-coordinate and a first y-coordinate of the first top die after the first top die is aligned with the first bottom die;
bonding the first top die onto the first bottom die;
calculating a second x-coordinate by adding the first x-coordinate and the relative x-coordinate, and a second y-coordinate by adding the first y-coordinate and the relative y-coordinate;
moving the second top die from the die tray to a second position corresponding to the second x-coordinate and the second y-coordinate; and
bonding the second top die onto the second bottom die.

8. The method of claim 7 further comprising bonding remaining ones of the top dies onto the bottom wafer, wherein each of the remaining ones of the top dies is bonded to a position shifted from the first x-coordinate and the first y-coordinate by a relative position without performing alignment actions.

9. The method of claim 7, wherein, during the moving the second top die, the second top die is not rotated along a vertical axis.

10. The method of claim 7, wherein the placing the top dies comprises:
providing a top wafer;
etching the top wafer along scribe lines; and
polishing the top wafer from a backside to separate the top dies, wherein the top dies have slanted edges matching slanted edges of the die holders, wherein from the bonding the first top die to the polishing the top wafer, no alignment is performed to align the second top die with the second bottom die.

* * * * *